United States Patent [19]

Sugino

[11] Patent Number: 5,291,456
[45] Date of Patent: Mar. 1, 1994

[54] DATA STORAGE CONTROL DEVICE

[75] Inventor: Koichi Sugino, Tokyo, Japan

[73] Assignee: Seikosha Co., Ltd., Tokyo, Japan

[21] Appl. No.: 906,640

[22] Filed: Jun. 30, 1992

[30] Foreign Application Priority Data

Jul. 4, 1991 [JP] Japan .................................. 3-164515

[51] Int. Cl.⁵ .............................................. G11C 8/00
[52] U.S. Cl. .................................. 365/230.01; 365/193
[58] Field of Search ............................. 365/230.01, 193

[56] References Cited

U.S. PATENT DOCUMENTS

| | | | |
|---|---|---|---|
| 4,792,929 | 12/1988 | Olson et al. | 365/193 X |
| 4,924,441 | 5/1990 | Inskeep | 365/193 X |
| 5,130,946 | 7/1992 | Watanabe | 365/230.01 X |

Primary Examiner—Eugene R. LaRoche
Assistant Examiner—Do Hyun Yoo
Attorney, Agent, or Firm—Jordan and Hamburg

[57] ABSTRACT

A data storage control device including a DRAM and a storage device has an address bus common to the DRAM and the storage device, and a control device for selectively applying an address signal relating to the DRAM and another address signal relating to the storage device to the address bus.

10 Claims, 2 Drawing Sheets

DATA STORAGE CONTROL DEVICE

FIELD OF THE INVENTION

This invention relates to a data storage control device.

BACKGROUND OF THE INVENTION

In conventional data storage control devices that include a dynamic RAM (referred to herein as a DRAM) and a ROM, a control circuit associated with a CPU or the like has a first group of address terminals for the DRAM and a second group of address terminals for the ROM, these groups being connected to separate address buses.

Since the conventional device uses separate address buses for the DRAM and the ROM, it is large in size and high in cost.

SUMMARY OF THE INVENTION

It is an object of the present invention to provide a data storage control device of simplified configuration.

To solve the foregoing problems, the present invention provides a data storage control device including a DRAM and storage means such as a ROM or the like, comprising common address bus means for the DRAM and the storage means, and control means for selectively applying address signals for the DRAM and address signals for the storage means to the address bus means.

BRIEF DESCRIPTION OF THE FIGURES

An embodiment of the present invention will now be described with reference to the drawings, whereby.

DESCRIPTION OF THE PREFERRED EMBODIMENTS

Figure 1:
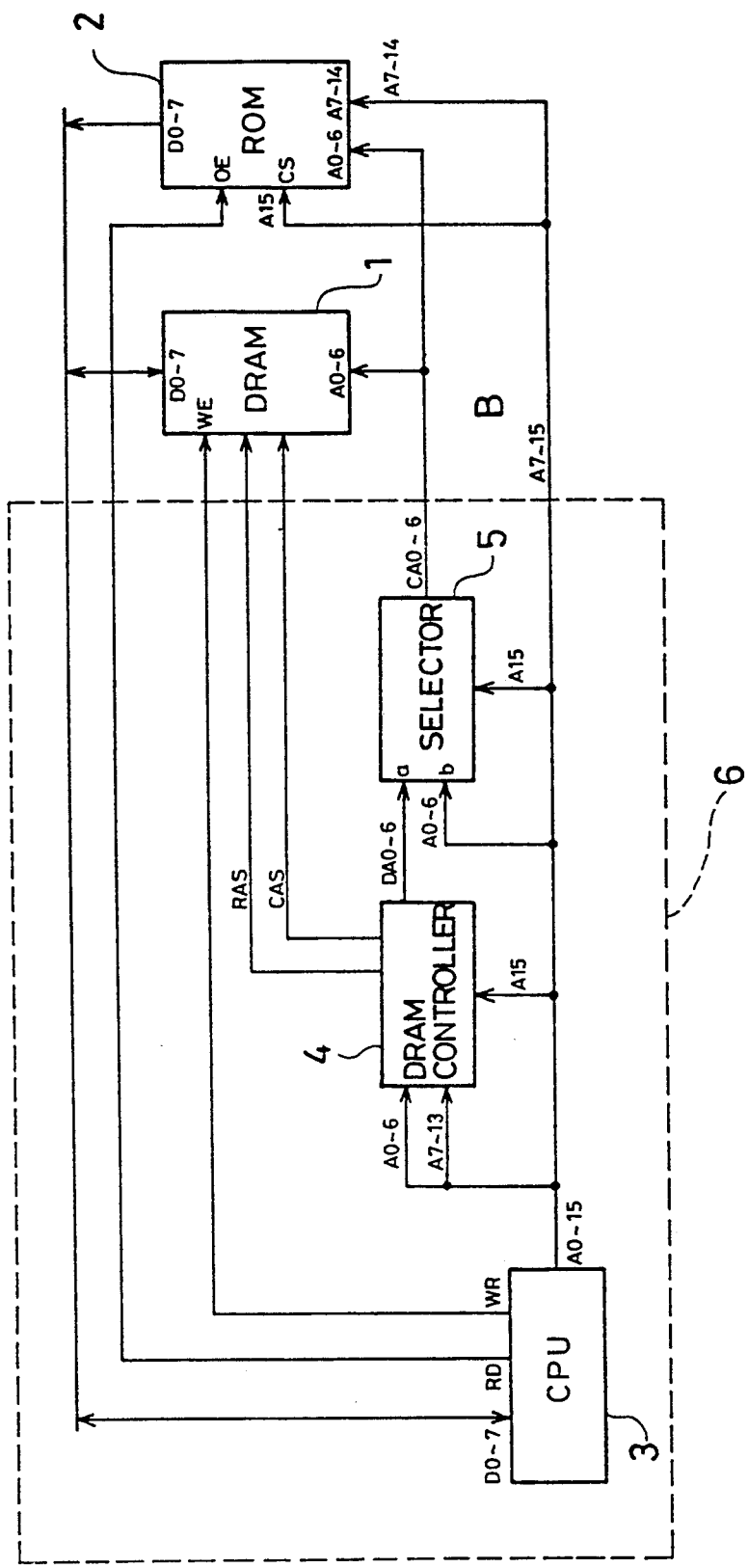
FIG. 1 is a block diagram showing an embodiment of the present invention.

In FIG. 1, DRAM 1 has seven address terminals A0-A6. Storage means 2 has fifteen address terminals A0-A14, and is a ROM in the present embodiment. CPU 3 controls data accessing with respect to the DRAM 1 and data reading with respect to the ROM 2. DRAM controller 4 controls addressing with respect to the DRAM 1, and a selector 5 selectively delivers address signals for the DRAM 1 and address signals for the ROM 2, these units constituting a control means 6. The CPU 3 and the DRAM controller 4 are synchronized with a common clock signal. In the illustrated embodiment, the seven address terminals of the DRAM 1 and the seven address terminals of the ROM 2 are connected to a common address bus B extending from the selector 5.

Referring to the time chart of FIG. 2, the process of accessing the DRAM 1 and the ROM 2 will be described. In this embodiment, the address signals are comprised of sixteen bits A0-A15, and the DRAM 1 is accessed when bit A15 is "1" (i.e. HIGH), whereas the ROM 2 is accessed when it is "0" (i.e. LOW).

Figure 2:
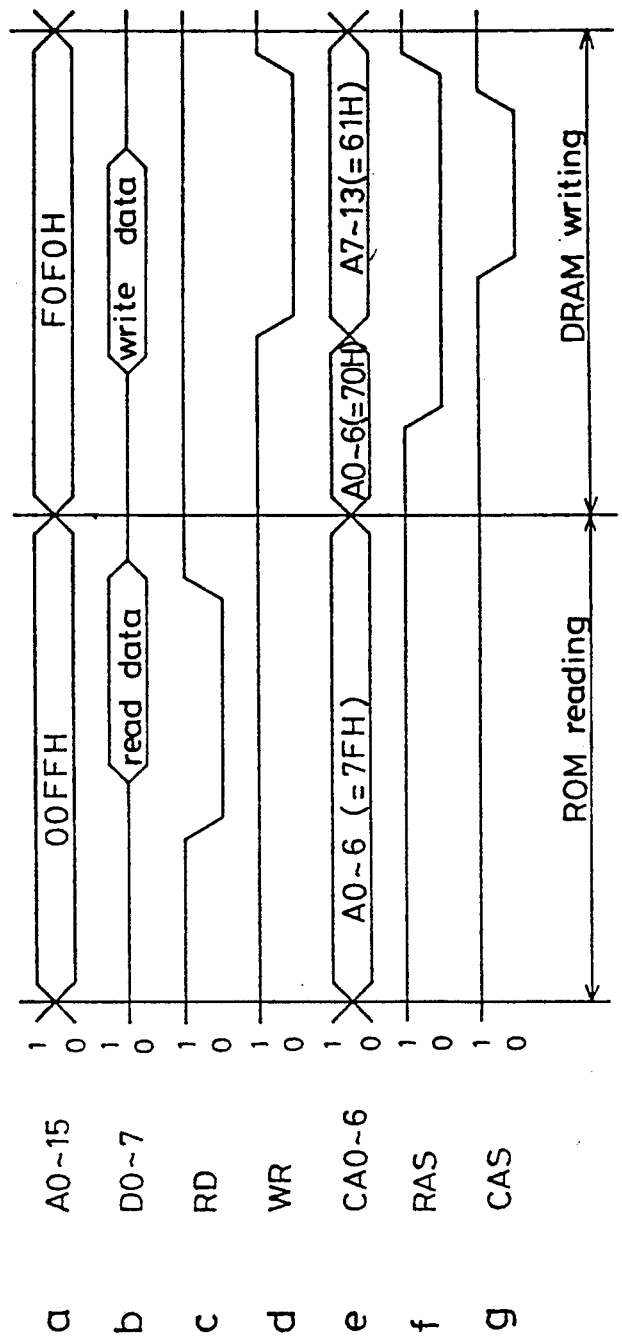
FIG. 2 is a time chart used in describing the operation of the device of FIG. 1.

First, assume, as shown at line a in FIG. 2 that address signal "OOFFH" is delivered from the CPU 3. Since bit A15 is "0", this address signal is used for the ROM 2. That is, since bit A15 is low, the selector 5 chooses its terminal b, and as shown at line e in FIG. 2, bits A0-A6 (=7FH) delivered from the CPU 3 are applied to the address bus B as seven lower-order address bits for the ROM 2. Bits A7-A14 are directly applied from the CPU 3 to the ROM 2. Bit A15 is applied to a CS (chip select) terminal of the ROM 2 to set the ROM 2 to an accessible state. Then, when a read signal RD delivered from the CPU 3 changes to "0" as shown at line c in FIG. 2, read data D0-D7 as shown at line b in FIG. 2 is read out from the address of the ROM 2 designated by bits A0-A14. It should be noted that when bit A15 is "0", the RAS (row address strobe) signal and CAS (column address strobe) signal delivered from the DRAM controller 4 are not "0", as shown at lines f and g in FIG. 2; thus, the DRAM 1 is not accessed.

Then, assume, as shown at line a in FIG. 2 that address signal "FOFOH" is delivered from the CPU 3. Since bit A15 is "1", this address signal is to be used for the DRAM 1. That is, since bit A15 is high, the selector 5 chooses its terminal a. The DRAM controller 4 delivers bits A0-A6 (=70H) and then bits A7-A13 (=61H) in a time sharing manner, these bits or the address signal being applied through the selector 5 to the address bus B as shown at line e in FIG. 2. Then, when the RAS signal changes to "0" as shown at line f in FIG. 2, bits A0-A6 are latched in the DRAM 1, and when the CAS signal changes to "0" as shown at line g in FIG. 2, bits A7-A13 are latched in the DRAM 1. Then, when a write signal WR delivered from the CPU 3 changes to "0" as shown at line d in FIG. 2, write data D0-D7 as shown at b in FIG. 2 is written at the address designated by bits A0-A13.

When data is to be read out from the DRAM 1, a process similar to the write process is performed under conditions in which the write signal WR delivered from the CPU 3 is not "0".

As described above, the DRAM 1 and ROM 2 can be accessed through the common address bus B.

As will be appreciated, the number of bits of the address signal and the number of storage units can be set arbitrarily. The storage means may be a static RAM or the like instead of a ROM.

According to the present invention, the address bus is used in common for the DRAM and the storage means; therefore, the components, such as address terminals and address buses, can be reduced, the device can be miniaturized, and the cost can be decreased.

What I claim is:

1. In a data storage control device including a dynamic RAM and storage means, each of which has address input terminals, and control means for addressing said dynamic RAM and storage means, the improvement wherein:

said control means is comprised of a processing means, a dynamic RAM control means and a selector means, for controlling access to said dynamic RAM and said storage means;

said processing means having data bus and address bus commonly used for said dynamic RAM and said storage means;

said address bus having N address lines, $n_1$ of said N address lines comprising a selection signal and $n_2$ of said N address lines other than said $n_1$ lines being directly connected to $n_2$ address input terminals of said storage means, wherein N, $n_1$ and $n_2$ are integers, $(N > n_1 \geq 1)$ and $(N > n_2)$;

means applying said $n_1$ lines to said dynamic RAM control means, whereby, when said $n_1$ of said N address lines has a first value, said dynamic RAM control means is activated, generates an RAS signal and a CAS signal for direct application to said dynamic RAM, and selectively generates address signals responsive to signals from said address bus; said selector means having $n_3$ address lines directly connected to address input terminals of said dynamic RAM and also connected to remaining address input terminals other than said $n_2$ address input terminals of said storage means, said selector means comprising means for selectively supplying said address signals from said dynamic RAM control means to said $n_3$ address lines for the dynamic RAM in response to said first value of said $n_1$ of said N address lines, and means for applying a part of the address signals from said dynamic RAM control means to said $n_3$ address lines for said storage means in response to a second value of said $n_1$ of said N address line wherein $n_3$ is an integer and $(N=n_1+n_2+n_3)$;

said storage means being accessed by said address signals from said $n_3$ address lines in conjunction with said remaining address signals from said $n_2$ of others of said N address lines.

2. The data storage control device of claim 1 wherein said storage means comprises a ROM.

3. The data storage control device of claim 1 wherein said storage means comprises a static RAM.

4. The data storage control device of claim 1 wherein said selection signal is used as a chip selection signal.

5. A data storage control device including a dynamic RAM and a storage means other than dynamic RAM, each of which has address input terminals, the improvement comprising:

an address bus having N address lines, including a first line and $n_1$ and $n_2$ second and third lines, respectively, said first, second and third lines being separate from one another, wherein N, $n_1$ and $n_2$ are integers;

control means comprising means for generating N address signals and applying said N address signals to separate ones of said N address lines, said third address lines being directly connected to separate first address input terminals of said storage means; said first address line being coupled to a selection input of said storage means to enable said storage means in response to a first level of said first address line;

DRAM controller means coupled to said first address line for enabling said dynamic RAM in response to a second level of said first address line; and selector means responsive to said first level of said first address line for coupling said second address lines to separate second address terminals of said storage means and responsive to said second level of said first address line for sequentially coupling different address lines through said second address lines to a common set of address terminals of said dynamic RAM.

6. The data storage control device of claim 5 wherein said DRAM controller means comprises means for controlling signal levels at RAS and CAS terminals of said dynamic RAM.

7. The data storage control device of claim 5 wherein said selection input of said storage means comprises a chip selection input.

8. The data storage control device of claim 5 wherein said control means comprises a CPU.

9. In a data storage control device including a dynamic RAM and a storage means other than dynamic RAM, each of which has address input terminals, said storage means having enabling input terminal means, the improvement comprising:

control means;

an address bus coupled to said control means and having N address lines, wherein N is an integer;

means coupling $n_1$ of said N address lines to separate address input terminals of said storage means and coupling one second line of said N address lines, different from said $n_1$ lines to said enabling input terminal means of said storage means, for enabling said storage means at a first signal level of said second address line, wherein $N>n_1$;

DRAM controller means coupled to said second address line for enabling said dynamic RAM in response to a second level of said second address line; and selector means for coupling $n_2$ of said N address lines to address said dynamic RAM, wherein $n_2$ is an integer, and said $n_2$ lines are different from said second line and said $n_1$ lines, and $N=n_1+n_2+1$.

10. The data storage control device of claim 9 wherein said DRAM controller means comprises means for controlling RAS and CAS lines of said dynamic RAM in response to said second level of said second address line.

* * * * *